United States Patent [19]
Marquot et al.

[11] Patent Number: 5,978,262
[45] Date of Patent: Nov. 2, 1999

[54] CIRCUIT AND METHOD OF LATCHING A BIT LINE IN A NON-VOLATILE MEMORY

[75] Inventors: Alexis Marquot, Arenthon; Jean-Claude Tarbouriech, Ville-la-Grand; Paul Dechamps, Ferney-Voltaire, all of France

[73] Assignee: Motorola, Inc., Schaumburg, Ill.

[21] Appl. No.: 09/009,290

[22] Filed: Jan. 20, 1998

[30] Foreign Application Priority Data

Jan. 30, 1997 [GB] United Kingdom .................... 9701851
Jan. 30, 1997 [GB] United Kingdom .................... 9701855
Jan. 30, 1997 [GB] United Kingdom .................... 9701968

[51] Int. Cl.$^6$ .................................................. G11C 16/14
[52] U.S. Cl. ................................ 365/185.01; 365/185.11; 365/189.05; 365/230.08
[58] Field of Search .......................... 365/185.11, 185.13, 365/185.23, 185.29, 185.33, 189.05, 230.08, 185.01

[56] References Cited

U.S. PATENT DOCUMENTS

| 4,408,306 | 10/1983 | Kuo ......................................... 365/218 |
| 4,751,678 | 6/1988 | Raghunathan .......................... 365/189 |
| 5,297,081 | 3/1994 | Challa ................................. 365/185.13 |
| 5,297,096 | 3/1994 | Terada et al. ....................... 365/185.11 |
| 5,337,281 | 8/1994 | Kobayashi et al. ................ 365/185.13 |
| 5,526,307 | 6/1996 | Yiu et al. ............................ 365/185.01 |
| 5,533,123 | 7/1996 | Force et al. ................................. 380/4 |

FOREIGN PATENT DOCUMENTS

| 282721 | 4/1995 | European Pat. Off. ... H03K 19/0185 |
| 0668658 A2 | 8/1995 | European Pat. Off. ... H03K 19/0185 |

Primary Examiner—David Nelms
Assistant Examiner—David Lam

[57] ABSTRACT

A portable data carrier (10) embodies an integrated circuit (12) with an EEPROM (24). The EEPROM has a number of rows of memory cells (32, 38, 44) each having outputs respectively coupled to bit lines (50, 54, 56), and control inputs coupled to a common control line (132). The bit lines each include a latch (60, 62, 64) that is set to provide a programming voltage (VPP) during write mode. The bit lines have serial switches (78, 80, 82) that break continuity when writing to the latches. The bit line latches are made transparent to the bit lines during read mode. The common control line is coupled through a programming transistor (130) to an erase line (72). The erase line must be driven to a programming voltage during erase mode. The erase line uses one of the bit line latches to provide its programming voltage.

31 Claims, 7 Drawing Sheets

CIRCUIT AND METHOD OF LATCHING A BIT LINE IN A NON-VOLATILE MEMORY

BACKGROUND OF THE INVENTION

The present invention relates in general to memory circuits and, more particularly, to a non-volatile memory having a latch on each bit line.

Electrically erasable programmable read only memories (EEPROMs) are found in many applications where it is necessary to use a non-volatile memory. One such application is in the field of portable data carriers (PDC), otherwise known as smart cards. A PDC is generally made of plastic, about the size of a conventional credit card, and includes one or more semiconductor die embedded in the PDC. The semiconductor die(s) include a microprocessor, memory, and various input and output (I/O) circuitry. While a conventional credit card with a magnetic strip typically stores a few hundred bits of data, the PDC with its expanded memory can store 8K or more 8-bit bytes of data.

The additional storage capacity of the PDC vastly expands its useful applications. For example, the PDC can be used to store the user's medical history. The user presents the PDC to a health care provider who, through a PDC reader, extracts the patient's medical history, including personal data, primary care physician, health insurance, allergies, medication, past procedures, blood type, religious preference, organ donor, etc. Other applications for PDCs include banking services, identification for nationality and passport, and transportation transactions such as ticket and fare collection. For example, the PDC can be programmed to hold a monetary value. When making a purchase, the user inserts the PDC into the PDC reader and the purchase amount is automatically deducted from the stored monetary value. PDCs are applicable virtually anywhere the user needs to convey or exchange data or information.

The PDC is available to operate in contact and contactless modes. In contact mode, the PDC is inserted into the PDC reader. The PDC reader comes in direct electrical contact with terminal pads on the PDC to supply operating power and to read and write data. In contactless mode, the PDC uses radio frequency (RF) transmission circuitry. The contactless PDC is placed in the vicinity of the PDC reader and the information exchange occurs over the RF link.

The PDC generally does not contain a local power source such as a battery. The PDC receives operating power at the beginning of each transaction by the direct electrical contact, or via the RF link. The memory area on the PDC is divided between random access memory (RAM), read only memory (ROM), and EEPROM. The RAM is volatile memory and maintains temporary data used only during the time that power is supplied by the PDC reader. The ROM and EEPROM are non-volatile memory and, although can only be accessed during the time that power is supplied by the PDC reader, maintain their contents even during times of zero operating power.

The EEPROM array is arranged in a matrix of rows and columns. A row of EEPROM cells has some multiple of groups of 8 cells corresponding to a number of 8-bit bytes. For example, an 8K EEPROM array includes 256 rows with each row having 256 memory cells (32 8-bit bytes/row). Each column of memory cells includes a bit line. The bit lines must be latched to certain voltage levels during programming modes. For example, in write mode, the bit lines are latched to a high programming voltage of 20 volts. Each latch coupled to a bit line includes a data bus interface, a flipflop, and a high voltage driver to the bit line. In the prior art, the memory cell rows are typically arranged in 4 bytes groupings with 32 latches servicing one 4 byte group. The same 32 latches are routed through a selection network to service other 4 byte groups. The latch circuit, selection network, interconnections, and associated address decoders tend to be complex and consume a large area. Moreover, the latch selection limits the access capability to only 4 bytes at a time. It is desirable to access all 256 memory cells in one row at a time to reduce overall programming time without increasing the layout area.

DETAILED DESCRIPTION OF THE PREFERRED EMBODIMENT

Figure 1:
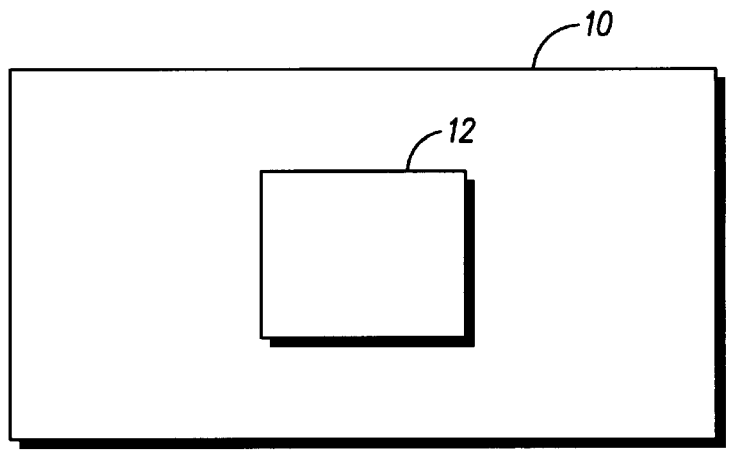
FIG. 1 illustrates a PDC with an embedded integrated circuit.

Referring to FIG. 1, a PDC 10, also known as a smart card or chip card, is shown with an embedded integrated circuit (IC) 12. IC 12 includes memory, I/O circuitry, and optionally a microprocessor or other controller, to allow PDC 10 to convey or exchange potentially large amounts of information with a PDC reader (not shown). PDC 10 is used in many applications such as banking, transportation, medical, identification, and security. For example, PDC 10 may contain the user's personal data, medical history, national identification, and/or passport. PDC 10 can store financial information such as bank account information, stock portfolio, and other investments. PDC 10 can store monetary value(s) which is automatically deducted from, including any applicable foreign exchange rates, each time the user conducts a transaction such as to pay transportation fares, purchase merchandise, or access long-distance telephone services. PDC 10 can store security codes for access to restricted areas.

PDC 10 operates in contact mode and contactless mode. In contact mode, PDC 10 is inserted into, or swiped through, a PDC reader that makes direct electrical contact with terminal pads on the PDC. The PDC reader provides operating power to PDC 10 and performs the necessary read and write operations to complete the transaction. For example, PDC 10 is inserted into a PDC reader of a vending machine and the purchase amount for the selected item is deducted.

In contactless mode, PDC 10 is brought into the vicinity of the PDC reader which transmits an RF signal to the PDC. PDC 10 includes one or more RF coils wound around the perimeter of the carrier that extract operating power from the RF signal to energize IC 12. The information between the PDC reader and PDC 10 is also exchanged over the RF link. For example, PDC 10 is held within a few centimeters of the PDC reader that controls a door lock. The PDC reader transmits an RF signal to supply operating power to PDC 10 which then transmits the user's identification and security access codes to the PDC reader. The user may also need to key in a personal identification number into a keypad on the PDC reader to gain access to the restricted area.

Figure 2:
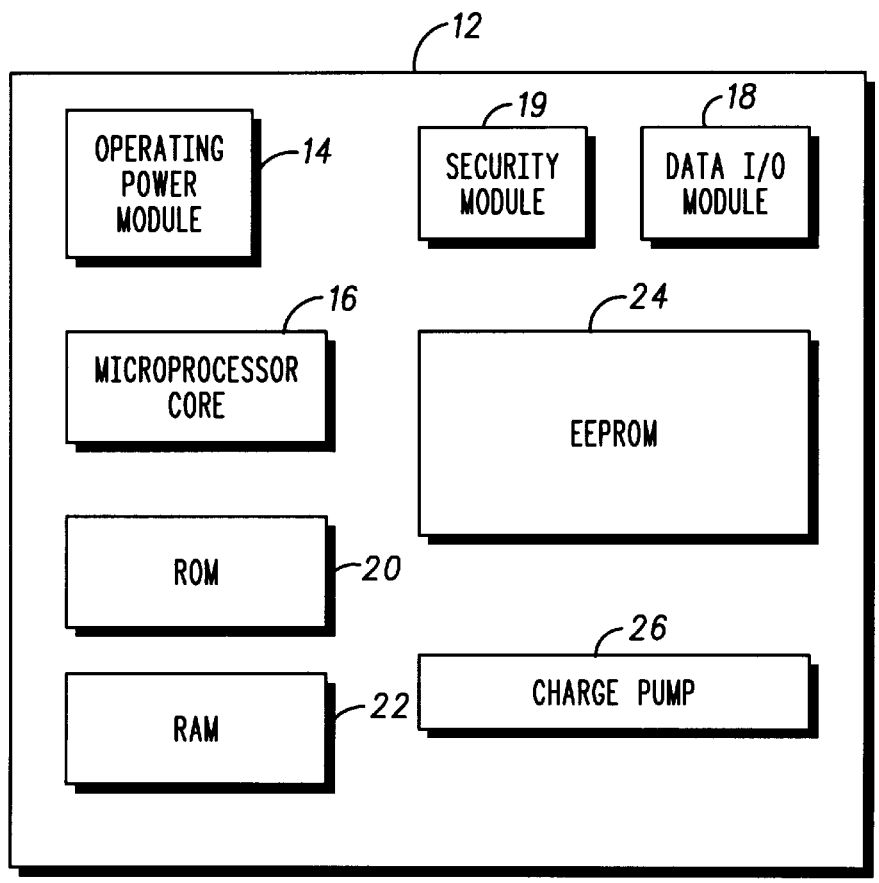
FIG. 2 is a block diagram illustrating the layout of the integrated circuit.

In FIG. 2, the layout of IC 12 is shown in further detail. Circuit 12 includes one or more semiconductor die for the circuitry shown. Operating power module 14 receives operating power either by direct contact with the PDC reader, or from an external RF coil embedded in PDC 10. Operating power module 14 distributes a positive power supply potential VDD, for example VDD=3 to 5 volts DC ±10%, to the other circuitry in IC 12. Microprocessor core 16 performs the control, timing, and decision making functions of PDC 10. For example, microprocessor 16 controls the read, write and erase operations to the memory and makes data available to data I/O module 18. Data I/O module 18 sends and receives data from the PDC reader. In contact mode, data I/O module 18 makes direct electrical contact with terminals on the PDC reader to exchange information. In contactless mode, data I/O module 18 interacts with the PDC reader over an RF link. An external RF data coil, possibly the same coil used for receiving operating power, is embedded in PDC 10. Data I/O module 18 receives data from the PDC reader over the RF link and demodulates the data for use by other modules in IC 12. Data I/O module 18 also modulates data from the memory modules for transmission over the RF link to the PDC reader. Security module 19 prevents unauthorized use or access of PDC 10 and routinely checks operating integrity.

ROM module 20 stores the program instructions for the given application which are set during the manufacturing process and then executed by microprocessor 16. ROM module 20 provides flexibility in programming the PDC for a variety of applications. ROM module 20 is non-volatile and ranges in size from 6K to 20K bytes of data. RAM module 22 is volatile memory and provides temporary storage of 256 to 512 bytes. EEPROM 24 is non-volatile memory array that stores the primary information of PDC 10 such as personal identification, medical history, banking information, monetary values, security codes, etc. depending on the application. The storage capacity of EEPROM 24 ranges from 8K to 64K 8-bit bytes of data, although greater capacities are within the scope of the present invention. Other types of non-volatile memory, e.g. flash memory, can be used in place of EEPROM 24.

IC 12 further includes charge pump 26 that receives VDD and provides a pumped voltage VPSW (voltage power switch) operating at either VDD=3 volts ±10% or VPP=20 volts ±10% in response to a data signal stored in a control register (not shown) by microprocessor 16. Charge pump 26 also provides an intermediate pumped voltage HVPN (high voltage protection NMOS) operating at 10 volts ±10% in programming mode (write and erase) and VDD=3 volts in read mode.

Figure 3:
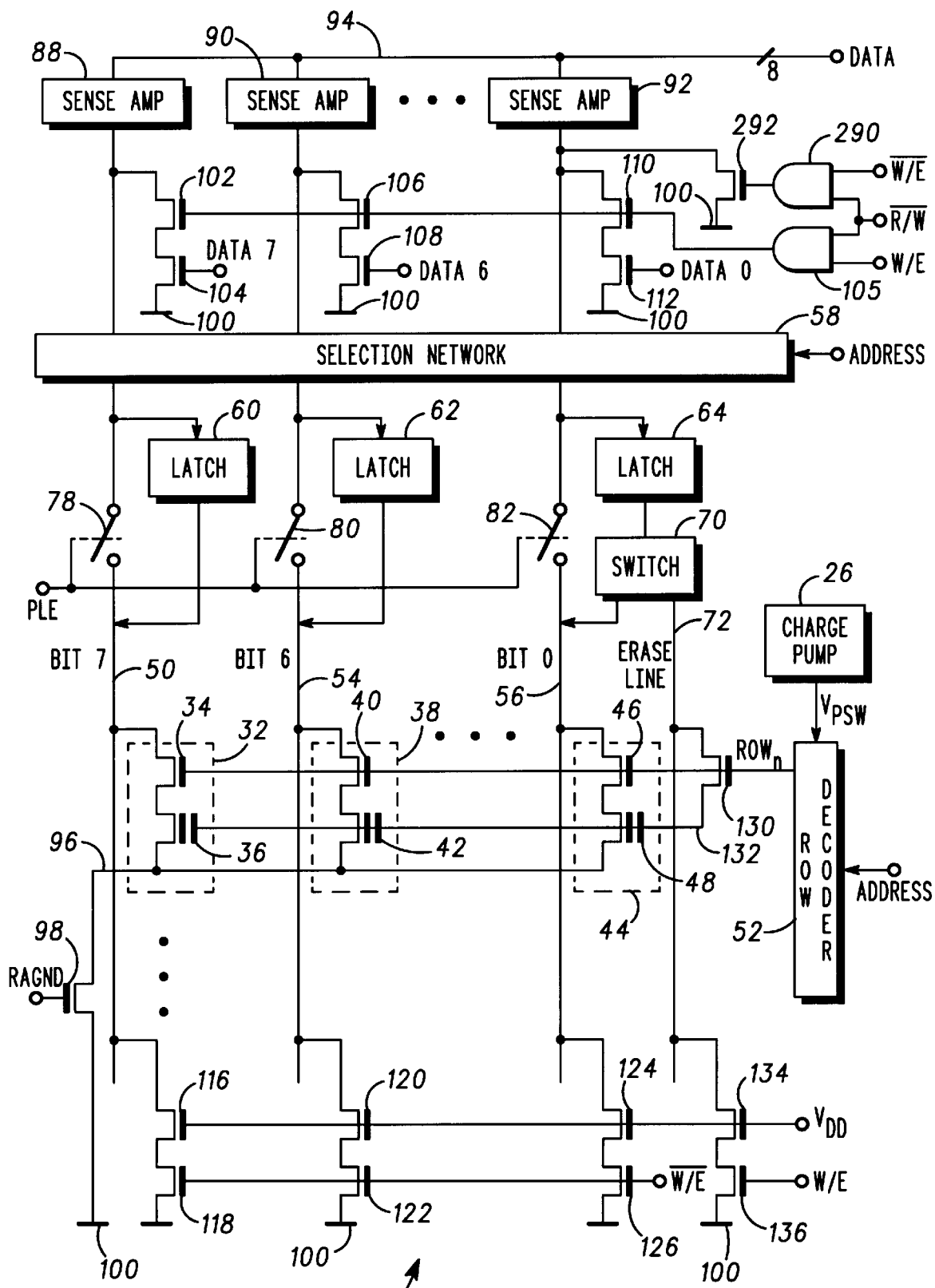
FIG. 3 is a block diagram of the EEPROM array.

EEPROM array 24 is shown in further detail in FIG. 3 as a matrix of EEPROM cells arranged in rows and columns. There are at least three modes of operation for EEPROM 24: erase mode, write mode, and read mode. Write mode and erase mode are programming modes. In erase mode, the contents of the select EEPROM cells are programmed to logic zero, i.e. the erase state. In write mode, the contents of the selected EEPROM cells are programmed to logic one, i.e. write state. In read mode, the contents of the selected EEPROM cells are read and placed on the data bus for transfer to data I/O module 18.

FIG. 3 illustrates three EEPROM cells in one row. The combination of one select transistor and one floating gate transistor comprise one EEPROM cell containing one bit of data. For example, a first EEPROM cell 32 comprises select transistor 34 and floating gate transistor 36. A second EEPROM cell 38 comprises select transistor 40 and floating gate transistor 42 in the first row. There are at least eight cells in each row representing one 8-bit byte. EEPROM cell 44 is the eighth cell in the first row and comprises select transistor 46 and floating gate transistor 48. In one embodiment, EEPROM array 24 has 32 8-bit bytes of data (256 cells) per row and 256 rows for a total capacity of 8K bytes.

In a first column, the drain of select transistor 34 is coupled to bit line 50 of EEPROM 24. Bit line 50 represents bit 7 of the 8-bit data byte. In the 8K embodiment, there are 256 EEPROM cells in one column connected to bit line 50. During any operation, 1 of the 256 rows is selected by a ROWn signal, where n ranges from 0 to 255. The ROWn control signal is decoded in row decoder 52 with an 8-bit ADDRESS signal from microprocessor 16. For example, an ADDRESS of "00000000" decodes to a logic one for the selected ROWn signal and logic zeroes for the other unselected row signals. Charge pump 26 provides a dual level power supply voltage VPSW to row decoder 52 so the actual voltage levels for logic one and logic zero depend on the memory operation. In write and erase operations, a logic one ROWn signal has a voltage level VPP=20 volts and a logic zero ROWn signal has a voltage level of VDD=3 volts. In a read operation, a logic one ROWn signal has a voltage level VDD=3 volts and a logic zero ROWn signal has a voltage level of zero volts. The logic one ROWn signal turns on select transistors 34, 40, and 46 to enable EEPROM cells 32, 38 and 44. The logic zeroes in the unselected rows turn off associated select transistors and disables all other EEPROM cells coupled to the bit lines.

In a second column, the drain of select transistor 40 is coupled to bit line 54. Again, there are 256 EEPROM cells in the column connected to bit line 54. Bit line 54 represents bit 6 of the 8-bit data byte. In the last column, the drain of select transistor 46 is coupled to bit line 56, as are the select transistors of 255 other EEPROM cells. Bit line 56 represents bit 0 of the data byte.

The sources of transistors 36, 42, and 48 are coupled to array ground node 96. The sources of all floating gate transistors in EEPROM array 24 are coupled to the common array ground node 96. Transistor 98 connects array ground node 96 to power supply conductor 100 operating at ground potential in response to a logic one control signal RAGND (reset array ground). Transistor 98 allows array ground node 96 to float in response to a logic zero control signal RAGND.

In the 8K embodiment, EEPROM array 24 has 256 bit lines coupled to selection network 58, three of which are shown in FIG. 3. There is one latch and one switching circuit for each of the 256 bit lines of EEPROM 24. The latches are used to program the EEPROM cells by providing either the programming voltage VPP or a high impedance depending on the data and control signals from microprocessor 16. The EEPROM programming sequence takes about 10 milliseconds which is much longer than the microprocessor write cycle (a few hundred nanoseconds). The latches provide intermediate data storage and allow microprocessor 16 to perform other tasks during the programming sequence. The switching circuit breaks continuity in the bit line when latching the programming voltage VPP, i.e. write mode. The switching circuit makes continuity in read mode.

When the switching circuits break continuity, the bit lines are separated into first and second sections. The first section of the bit line connects through the selection network to the sense amps. The second section of the bit line connects to the memory cells. Latch 60 reads a first voltage, e.g. zero volts, from the first section of bit line 50 and latches a second voltage, e.g. VPP=20 volts, onto the second section of bit line 50. Similarly, latch 62 reads a first voltage from a first section of bit line 54 and latches a second voltage onto a second section of bit line 54. Latch 64 reads a first voltage from a first section of bit line 56. The output of latch 64 is routed through switching circuit 70 to either bit line 56 during write mode, or to erase line 72 during erase mode. The input and output of the latches are high impedance in read mode.

The switching circuits that make and break the bit line are shown as switching circuits 78, 80, and 82. Switch 78 closes and completes continuity in bit line 50 in response to a PLE (program latch enable) control signal. Microprocessor 16 sets the PLE control signal in the control register to logic one during read mode and logic zero during write and erase modes. The logic one PLE control signal closes switch 78 to by-pass latch 60. The latch becomes transparent to the operation of EEPROM 24 as described below. When the PLE control signal goes to logic zero during programming modes, switch 78 opens and allows latch 60 to control bit line 50. The logic one PLE signal also closes switch 80 and completes continuity in bit line 54. Closing switch 80 by-passes latch 62 and the latch becomes transparent to the operation of EEPROM 24. When the PLE control signal goes to logic zero, switch 80 opens and allows latch 62 to control bit line 54. The logic one PLE signal closes switch 82 and completes continuity in bit line 56. Closing switch 82 by-passes latch 64 and the latch becomes transparent to the operation of EEPROM 24. When the PLE control signal goes to logic zero, switch 82 opens and allows latch 64 to control bit line 56 or erase line 72 depending on which path is enabled through switching circuit 70.

The 256 bit lines are coupled to selection network 58. Selection network 58 comprises a plurality of pass transistors arranged in a tree network and controlled by the ADDRESS signal from microprocessor 16 to select 8 (1 byte) of the 256 bit lines. The 8 selected bit lines are connected through selection network 58 to 8 sense amps. For example, selection network 58 responds to one ADDRESS value to connect the bit lines 50, 54, and 56 to sense amps 88, 90, and 92, respectively. Selection network 58 responds to another ADDRESS value to connect the bit lines of another group of EEPROM cells in different columns to the 8 sense amps 88–92.

During a read operation, bit line 50 conducts a current, or no current, to sense amp 88 depending on the contents of the selected EEPROM cell in the first column. If sense amp 88 senses current flow in bit line 50, it places a logic one on bit 7 of 8-bit data bus 94. If sense amp 88 senses zero current flow in bit line 50, it places a logic zero on bit 7 of data bus 94. Bit line 54 conducts a current or zero current to sense amp 90 depending on the contents of the selected EEPROM cell in that column. Sense amp 90 senses the current flow in bit line 54 and places a corresponding logic value on bit 6 of data bus 94. There are five additional bit lines (not shown) representing bit 5 to bit 1 with corresponding EEPROM cells and sense amps similar to bit 7 and bit 6. Bit line 56 conducts a current or zero current to sense amp 92 depending on the contents of the selected EEPROM cell in that column. Sense amp 92 senses the current flow in bit line 56 and places a corresponding logic value on bit 0 of data bus 94. The 8-bit data byte on bus 94 is routed to data I/O module 18 for transfer to the PDC reader.

EEPROM 24 includes pull-down transistors coupled through selection network 58 to each bit line. Transistors 102 and 104 are cascoded together with the drain of transistor 102 coupled to bit line 50 and the source of transistor 104 coupled to power supply conductor 100. When writing into the latch, the $\overline{R/W}$ signal is logic one and W/E (write/erase) is logic one. The $\overline{R/W}$ signal is the complement of R/W. The output of AND gate 105 is logic one and DATA7 is set to logic one to turn on transistors 102 and 104 and pull bit line 50, through selection network 58, to logic zero. Transistors 106 and 108 are cascoded together with the drain of transistor 106 coupled to bit line 54 and the source of transistor 108 coupled to power supply conductor 100. When writing into the latch, the output of AND gate 105 is logic one and DATA6 is set to logic one to turn on transistors 106 and 108 and pull bit line 54, through selection network 58, to logic zero. Transistors 110 and 112 are cascoded together with the drain of transistor 110 coupled to bit line 56 and the source of transistor 112 coupled to power supply conductor 100. When writing into the latch, the output of AND gate 105 is logic one and DATA0 is set to logic one to turn on transistors 110 and 112 and pull bit line 56, through selection network 58, to logic zero. DATA0, DATA6, and DATA7 are data bits from data bus 94. The function of pull-down transistors 102–112 is to set a zero voltage level on the first section of the bit lines to write into latches 60–64.

EEPROM 24 further includes pull-down transistors 116 and 118 cascoded together with the drain of transistor 116 coupled to bit line 50 and the source of transistor 118 coupled to power supply conductor 100. Transistors 120 and 122 are cascoded together with the drain of transistor 120 coupled to bit line 54 and the source of transistor 122 coupled to power supply conductor 100. Transistors 124 and 126 are cascoded together with the drain of transistor 124 coupled to bit line 56 and the source of transistor 126 coupled to power supply conductor 100. Transistors 116, 120, and 124 are controlled by VDD, and transistors 118, 122, and 126 are controlled by the $\overline{W/E}$ control signal. The pull-down transistors are cascoded to avoid reverse breakdown with the high voltage VPP on the bit lines. The $\overline{W/E}$ control signal is the complement of the W/E control signal which is set in the control register by microprocessor 16. The W/E is logic one during write mode and logic zero during erase mode. The function of pull-down transistors 116–126 is to set the bit lines, and consequently the drains of the floating gate transistors in the selected row, to zero volts during erase mode.

To provide the appropriate gate voltage to the floating gates of the memory cells during write mode, erase mode and read mode, EEPROM 24 includes programming transistor 130 having a drain coupled to erase line 72 and a source coupled to control line 132 at the floating gates terminals in the first row, e.g. transistors 36, 42, and 48. The gate of transistor 130 receives the ROWn signal. Erase line 72 services 8 cells in each of 256 rows. EEPROM array 24 has 32 erase lines for the 32 bytes in each row.

EEPROM 24 further includes pull-down transistors 134 and 136 on erase line 72. The pull-down transistors 134 and 136 are cascoded to avoid reverse breakdown with the high voltage VPP on the erase line. The drain of transistor 134 is coupled to erase line 72 and the source of transistor 136 is coupled to power supply conductor 100. The gate of transistor 134 receives VDD for reverse breakdown protection, and the gate of transistor 136 receives the W/E control signal. The W/E control signal is logic one when EEPROM 24 is write mode.

First consider the operation of one cell of EEPROM 24. In the physical structure of transistor 36, a control gate is disposed above a floating gate, and the floating gate is disposed above the channel between the drain and source regions separated by a narrow oxide layer approximately 100 angstroms thick.

To erase the contents of EEPROM cell 32, latch 60 is reset to provide high impedance to bit line 50. The $\overline{\text{W/E}}$ control signal is set to logic one to enable transistor 118 and pull bit line 50 to logic zero. The ADDRESS signal sets the ROWn signal to the programming voltage VPP to enable select transistor 34 and pass the zero voltage from bit line 50 to the drain of transistor 36. Latch 64 and switching circuit 70 are set, as described below, to apply the programming voltage VPP to erase line 72. The W/E control signal is logic zero to disable the pull-down transistor 136. The ROWn signal operating at VPP enables transistor 130 and places the programming voltage VPP on the gate of transistor 36. The control signal RAGND is set to a logic one to turn on transistor 98 and place a zero voltage on the source of transistor 36.

The high electric field on the floating gate extracts negative charges from the drain and source regions of transistor 36 across the narrow oxide layer by a process commonly known as tunnel effect. The negative charges on the floating gate attract holes, i.e. positive charges, to the channel region and render transistor 36 in a non-volatile, non-conductive erase state. The charges are stored on the floating gate have a life span of approximately 10 years. In the erase state, transistor 36 has a positive threshold voltage (VT) of about 5 volts. That is, the voltage applied to the control gate must be at least 5 volts greater than the source voltage before transistor 36 conducts.

In read mode, the gate and source of transistor 36 both receive zero volts, i.e. gate-source voltage (VGS) is zero. If EEPROM cell 32 is in its erase state, no current flows between the drain and source of transistor 36 because VGS=0 is not greater than VT=5. Sense amp 88 detects zero current flow in bit line 50 and provides a logic zero voltage on bit 7 of data bus 94.

To write a value to EEPROM cell 32, the programming voltage VPP from latch 60 is placed on the drain of transistor 36, and a zero voltage from pull-down transistor 136 is placed on the gate of transistor 36. The control signal RAGND is set to a low level to turn off transistor 98 and float the source of transistor 36. The programming voltage VPP=20 volts DC on the drain of transistor 36 imposes a high electric field across the drain-gate junction and extracts negative charges from the floating gate. The lack of negative charge creates holes or positive charge on the floating gate. The positive charges on the floating gate attract electrons, i.e. negative charges, to the channel region and render transistor 36 in a non-volatile, conductive write state. In the write state, transistor 36 has a negative VT of about -5 volts. That is, the voltage applied to the control gate must be at least 5 volts less than the source voltage in order for transistor 36 to become non-conductive.

In read mode, the gate and source of transistor 36 both receive zero volts, i.e. VGS is zero. If EEPROM cell 32 is in its write state, a 50 microamp current flows between the drain and source of transistor 36 because VGS=0 is greater than VT=-5. Sense amp 88 detects a current flow in bit line 50 and provides a logic one voltage on bit 7 of data bus 94. The other EEPROM cells are erased, written to and read from in a similar manner.

Figure 4:
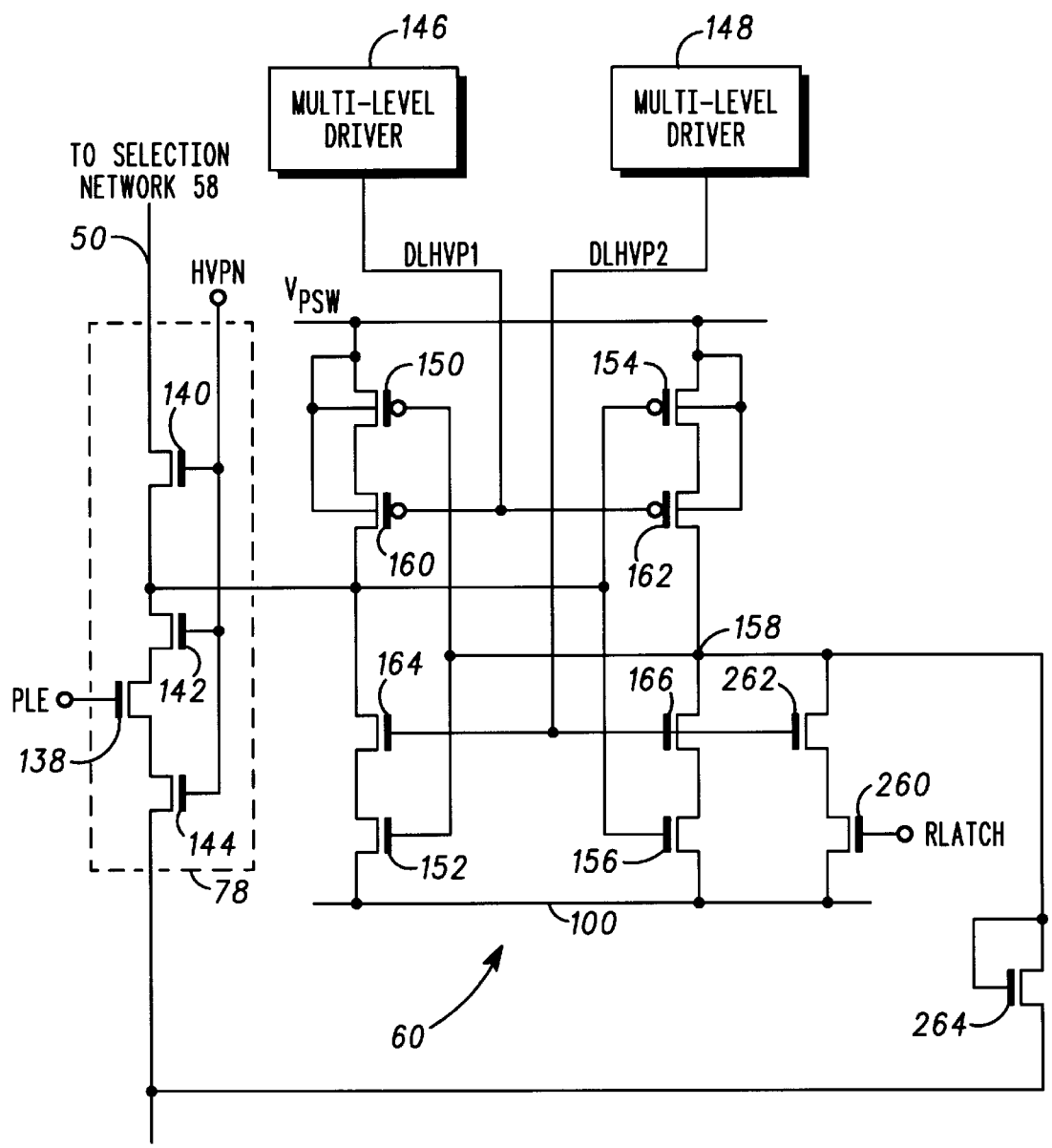
FIG. 4 is a schematic and block diagram of a bit line latch.

Further detail of latch 60 and switch 78 are shown in FIG. 4 including pass transistor 138 serially coupled with high voltage protection transistors 140, 142, and 144 in bit line 50. The gates of the high voltage protection transistors 140, 142, and 144 receive HVPN from charge pump 26. Pass transistor 138 makes and breaks continuity in bit line 50 in response to the PLE control signal. When PLE is logic zero, pass transistor 138 is non-conductive and bit line 50 is separated into first and second sections. Latch 60 receives a zero voltage on the first section of bit line 50 from pull-down transistors 102 and 104 to set the latch. During programming mode, the output of latch 60 is set to VPP=20 volts which is then applied to the second section of bit line 50. When PLE is logic one, pass transistor 138 conducts and by-passes latch 60. Latch 60 is made transparent and isolated from bit line 50 by controlling DLHVP1 (data latch high voltage protection) and DLHVP2 as described below. A multi-level driver circuit 146 provides one of four voltage levels on DLHVP1, i.e. VPP=20, HVPN=10, VDD=3, or zero volts, as determined by data values stored in the control register by microprocessor 16. Multi-level driver circuit 148 also provides one of four voltage levels on DLHVP2 as determined by data values stored in the control register.

Latch 60 comprises back-to-back inverters to perform the latching function. Transistors 154 and 156 are configured as a first inverter and transistors 150 and 152 are configured as a second inverter. The input of inverting transistors 154–156 are coupled to bit line 50 and their output is coupled to the input of inverting transistors 150–152 at node 158. The output of inverting transistors 150–152 is coupled to bit line 50. Transistors 150 and 154 are sized to have high resistance and relative low drive strength. Transistor 160 is cascoded with transistor 150 and operates in response to DLHVP1 to provide high voltage protection from the high voltage VPSW. Transistor 162 is cascoded with transistor 154 and operates in response to DLHVP1 to provide high voltage protection from the high voltage VPSW. Transistor 164 is cascoded with transistor 152 and operates in response to DLHVP2 to provide high voltage protection from the high voltage VPSW. Transistor 166 is cascoded with transistor 156 and operates in response to DLHVP2 to provide high voltage protection from the high voltage VPSW. The substrates of transistors 150 and 160 are coupled to VPSW to prevent substrate injection. Likewise, the substrates of transistors 154 and 162 are coupled to VPSW to prevent substrate injection.

Transistors 160, 162, 164 and 166 also operate as an isolation circuit coupled in the conduction paths of latch 60. Transistor 160 is coupled in the conduction path of transistor 150, and transistor 162 is coupled in the conduction path of transistor 154. Transistor 164 is coupled in the conduction path of transistor 152, and transistor 166 is coupled in the conduction path of transistor 156. By selecting the proper levels of DLHVP1 and DLHVP2, the isolation transistors 160–166 can disable the conduction paths through latch 60 and make it transparent to bit line 50. For example, in read mode, DLHVP1 is set to VDD and DLHVP2 is set to zero voltsoto turn off transistors 160–166 and isolate the input and output of latch 60 from bit line 50. Latches 62 and 64 and switching circuits 80 and 82 follow a similar construction and operation as described for latch 60 and switching circuit 78.

Figure 5:
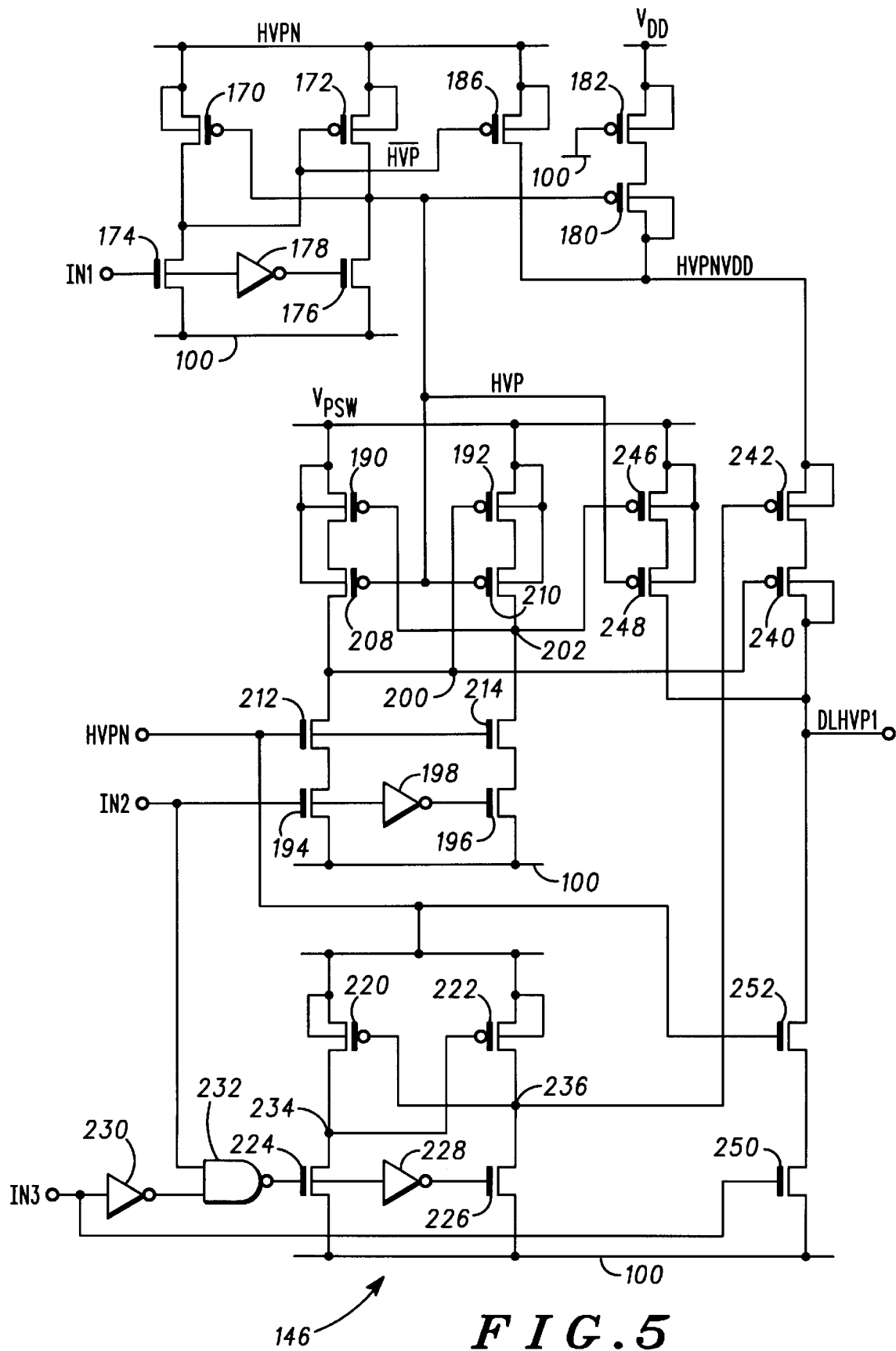
FIG. 5 is a schematic diagram of a multi-level driver.

The multi-level driver 146 as shown in FIG. 5 provides DLHVP1. Multi-level driver 148 follows a similar construction and operation as described for driver 146. The combination of transistors 170, 172, 174, 176 and inverter 178 comprise a level switching circuit. The gate of transistor 174 receives a data signal IN1 from the control register. If IN1 is logic one (VDD), transistor 174 conducts. Inverter 178 complements IN1 and produces a logic zero that turns off transistor 176. Transistor 174 pulls down $\overline{\text{HVP}}$ (high voltage protection) to zero volts and turns on transistor 172. The HVP signal is pulled up to substantially the voltage HVPN. The voltage HVPN is generated from VDD by charge pump 26 and operates at a level of 10 volts during programming modes. The zero voltage on $\overline{\text{HVP}}$ turns on transistor 186 and pulls the HVPNVDD (high voltage protection NMOS/VDD) to HVPN. Transistor 180 remains non-conductive because of the logic one HVP signal.

If IN1 is logic zero, transistor 174 turns off and transistor 176 turns on with the logic one at the output of inverter 178. Transistor 176 pulls HVP down to zero volts and turns on transistor 170. The $\overline{\text{HVP}}$ signal is pulled up to substantially the voltage HVPN. The low voltage on HVP turns on transistor 180 and pulls the HVPNVDD signal to substantially the voltage VDD. Transistor 182 is biased at zero volts and conducts with transistor 180. Transistor 182 has high resistivity and limits current flow through transistor 180. Transistor 186 remains non-conductive because of the logic one $\overline{\text{HVP}}$ signal. The substrates of transistors 170, 172, and 186 are coupled to HVPN, and the substrate of transistor 180 is coupled to HVPNVDD, to prevent substrate current injection and latch-up problems during power-on reset.

Thus, transistor 170–186 comprise a two level driver that provides an output signal HVPNVDD with a voltage level of HVPN (10 volts) or VDD (3 volts) depending on the value of IN1.

Continuing with multi-level driver 146, transistors 190, 192, 194, 196 and inverter 198 operate similar to transistors 170–176 and inverter 178. The gate of transistor 194 receives a data signal IN2 from the control register. If IN2 is logic one (VDD), transistor 194 conducts. Inverter 198 complements IN2 and produces a logic zero that turns off transistor 196. Transistor 194 pulls down node 200 to zero volts and turns on transistor 192. Node 202 is pulled up to substantially the voltage VPSW. The voltage VPSW is generated from VDD by charge pump 26 using a similar two level driver as transistors 170–186. The voltage VPSW operates at either VPP=20 volts or VDD=3 volts depending on the data value stored in its control register. In write mode and erase mode, the voltage VPSW is set to VPP=20 volts. In read mode, the voltage VPSW is set to VDD=3 volts. Transistor 208 is cascoded with transistor 190 and operates in response to HVP to provide high voltage protection from the high voltage VPSW. Transistor 210 is cascoded with transistor 192 and operates in response to HVP to provide high voltage protection from the high voltage VPSW. Transistor 212 is cascoded with transistor 194 and operates in response to HVPN to provide high voltage protection from the high voltage VPSW. Transistor 214 is cascoded with transistor 196 and operates in response to HVPN to provide high voltage protection from the high voltage VPSW. The substrates of transistors 190, 192, 208, 210 are coupled to VPSW to prevent substrate current injection and latch-up problems during power-on reset.

Transistors 220, 222, 224, 226 and inverter 228 also operate similar to transistors 170–176 and inverter 178. A data signal IN3 from the control register is inverted by inverter 230 and applied to one input of NAND gate 232. The other input of NAND gate 232 receives the IN2 signal. The output of NAND gate 232 is coupled to the gate of transistor 224. If IN3 is logic zero and IN2 is logic zero, then the output of NAND gate 232 is logic one (VDD) and transistor 224 conducts. Inverter 228 produces a logic zero and turns off transistor 226. Transistor 224 pulls node 234 down to zero volts and turns on transistor 222. Node 236 is pulled high to substantially the voltage HVPN (10 volts) rendering transistor 220 non-conductive. The substrates of transistors 220 and 222 are coupled to HVPN to prevent substrate current injection and latch-up problems during power-on reset.

If IN2 is logic one and IN3 is logic zero, the output of NAND gate 232 is logic zero in which case transistor 224 turns off. Inverter 228 complements the logic zero from NAND gate 232 and turns on transistor 226 to pull node 236 to zero volts. The zero volts at node 236 turns on transistor 220 and pulls node 234 to substantially the voltage HVPN rendering transistor 222 non-conductive.

The zero voltage on node 200 turns on transistor 240. A zero voltage at node 236, caused by IN2 operating at logic one and IN3 operating at logic zero, turns on transistor 242 and pulls DLHVP1 to the value of HVPNVDD. The substrate of transistor 240 is coupled to DLHVP1 and the substrate of transistor 242 is coupled to HVPNVDD, to prevent substrate current injection and latch-up problems during power-on reset.

A high voltage VPSW on node 200 turns off transistor 240. The corresponding zero voltage at node 202 turns on transistor 246 and pulls DLHVP1 to VPSW. Transistor 248 is cascoded with transistor 246 and operates in response to HVP to provide high voltage protection from the high voltage VPSW. The substrate of transistors 246 and 248 are coupled to VPSW to prevent substrate current injection and latch-up problems during power-on reset.

The IN3 signal is also applied to the gate of transistor 250. A logic one IN3 signal turns on transistor 250 and pulls DLHVP1 to zero volts. Transistor 252 is cascoded with transistor 250 and operates in response to HVPN to provide high voltage protection from the high voltage VPSW.

The overall operation of multi-level drivers 146 and 148 is better understood from Table 1. Programming DLHVP1 and DLHVP2 to one of four voltage levels follows the entries in Table 1. For example, in order to set up multi-level driver 146 to generate a voltage level VPP=20 volts, the first row of conditions must be true. The programming voltage VPSW is set to VPP=20 volts by charge pump 26. The data signal IN1 is logic one in which case HVP is HVPN=10 volts and HVP is equal to zero volts. Transistor 186 conducts and HVPNVDD becomes equal to HVPN. The IN2 and IN3 are both logic zero which translates into node 200 operating at VPP=20 volts, node 202 at zero volts, and node 236 at HVPN. Transistors 240 and 242 are non-conductive. Transistor 246 conducts and pulls DLHVP1 to VPP=20 volts.

TABLE 1

| DLHVP1 | VPSW | IN1 | HVP | HVPNVDD | NODE 200 | NODE 202 | IN2 | IN3 | NODE 236 |
|---|---|---|---|---|---|---|---|---|---|
| VPP | VPP | 1 | HVPN | HVPN | VPP | zero | 0 | 0 | HVPN |
| HVPN | VPP | 1 | HVPN | HVPN | zero | VPP | 1 | 0 | zero |
| VDD | VDD | 0 | zero | VDD | zero | VDD | 1 | 0 | zero |
| zero | VDD | 0 | zero | VDD | zero | VDD | 1 | 1 | HVFN |

Returning to FIG. 4, a pull-down transistor 260 is coupled between node 158 and power supply conductor 100 to reset the latch. Transistor 260 has more drive capacity than transistor 154. Therefore, transistor 260 pulls node 158 to zero volts in response to a logic one RLATCH (reset latch) signal. Transistor 262 is cascoded with transistor 260 and operates in response to DLHVP2 to provide high voltage protection from the high voltage VPSW. Diode-configured transistor 264 is coupled between node 158 and the second section of bit line 50 to provide high impedance when reverse biased. Transistor 264 has a relatively high forward impedance to avoid over-writing any value stored on the inverters. The common gate and drain of transistor 264 operate as the anode, and the source operates as the cathode.

The overall operation of latch 60 is better understood from Table 2.

TABLE 2

| OPERATING MODE | VPSW | DLHVP1 | DLHVP2 | state |
|---|---|---|---|---|
| LATCH RESET | VDD | zero | VDD | reset |
| LATCH WRITE | VDD | zero | VDD | set |
| PROGRAM PHASE | VPP | HVPN | HVPN | set |
| READ | VDD | VDD | zero | hi-Z |

First consider data latch reset mode. The programming voltage VPSW is set to VDD in charge pump 26. Transistors 102 and 104 are non-conductive. The PLE is logic zero to turn off transistor 138 and break continuity between the first and second sections of bit line 50. DLHVP1 is set to zero volts and DLHVP2 is set to VDD to enable latch 60. RLATCH goes to logic one by microprocessor 16 setting a control bit in the control register. Transistor 260 conducts and pulls node 158 to zero volts reverse biasing diode-configured transistor 264. The zero volts on node 158 turns on transistor 150 which in turn pulls the first section of bit line 50 to the voltage level of VPSW=3 volts. The high voltage (VDD) on the first section of bit line 50 turns on transistor 156 and latches zero volts at node 158.

To write to latch 60, the programming voltage VPSW is set to VDD in charge pump 26. DLHVP1 is set to zero volts in multi-level driver 146, and DLHVP2 is set to VDD=3 volts in multi-level driver 148 to enable latch 60. RLATCH is set to logic zero turning off transistor 260. The $\overline{R/W}$ control signal goes to logic one and W/E is logic one and DATA7 is logic one to turn on transistors 102 and 104 and pull bit line 50 to zero volts. The PLE signal is logic zero to turn off transistor 138 and separate bit line 50 into its first and second sections. The zero volts on the first section of bit line 50 turns on transistor 154 which in turn pulls node 158 to the voltage level of VDD=3 volts. The high voltage (VDD) at node 158 turns on transistor 152 and latches zero volts on bit line 50 and VDD=3 volts on node 158.

The program phase follows latch write phase. In program phase, which includes write mode and erase mode, the programming voltage VPSW is brought up to VPP=20 volts by charge pump 26. Transistor 154 now pulls node 158 up to VPP=20 volts. DLHVP1 is set to HVPN and DLHVP2 is set to HVPN to control high voltage protection transistors 160, 162, 164, and 166 with the programming voltage VPSW=20 volts.

In read mode, latch 60 becomes transparent to bit line 50. The programming voltage VPSW is set to VDD=3 volts by charge pump 26. DLHVP1 is set to VDD=3 volts which turns off transistors 160 and 162. DLHVP2 is set to zero volts which turns off transistors 164 and 166. Therefore, all conduction paths through the latch are disabled. The input and output of the latch are isolated from the bit line.

In an alternate embodiment, latch 60 can be made transparent to bit line 50 by turning on transistor 260 to pull node 158 to zero volts which turns off transistor 152. DLHVP1 is set to VDD to turn off transistors 160 and 162. The gate voltage of transistor 156 is unknown but since its source and drain are both at zero volts, its conduction state is irrelevant. All conduction paths through the latch are disabled and the input and output of the latch are isolated from the bit line.

During the erase operation, the bit lines are pulled down to zero volts by transistors 116–126. The latches 60–64 are not used by the bit lines. Since the latches on the bit lines are idle, it would be advantageous to use one for the erase line instead of having a separate erase line latch. Switching circuit 70 allows bit line 56 and erase line 72 to share one of the bit line latches, e.g. latch 64. Sharing one of the bit line latches to drive the erase line eliminates the need for a separate erase line latch and saves die area.

Figure 6:
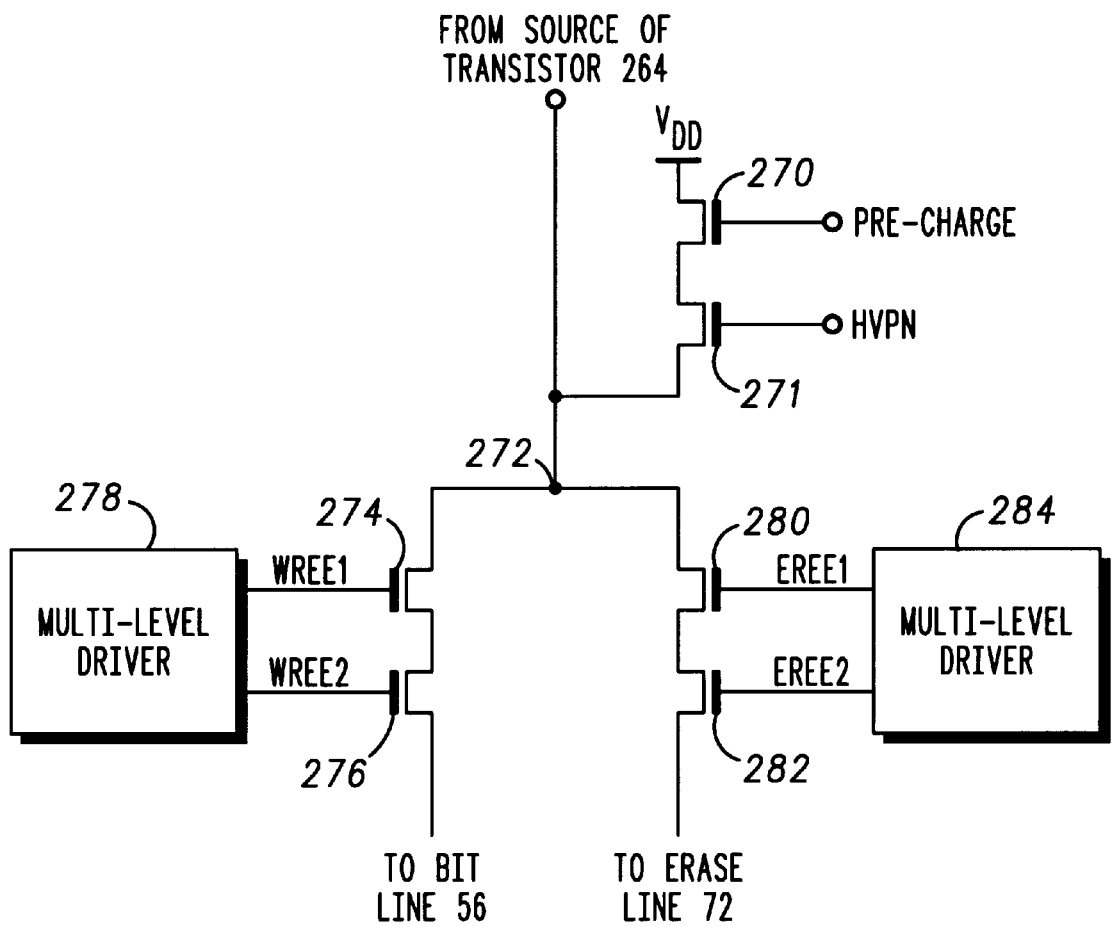
FIG. 6 is a schematic and block diagram of a switching circuit.

Switching circuit 70 is shown in FIG. 6 including transistor 270 which pre-charges node 272 at the output of latch 64 in response to a PRE-CHARGE signal. Transistor 271 provides high voltage protection with HVPN. Transistors 274 and 276 are coupled between node 272 and bit line 56. Transistors 274 and 276 receive control signals WREE1 and WREE2 (write EEPROM) from multi-level driver 278, respectively. Transistors 280 and 282 are coupled between node 272 and erase line 72. Transistors 280 and 282 receive control signals EREE1 and EREE2 (erase EEPROM), respectively.

The PRE-CHARGE signal is set to logic one in the control register by microprocessor 16 during the erase cycle. The pull-up transistors 150 and 154 in latch 64 are relatively weak devices. The capacitive loading on erase line 72 could over-write the latch without pre-charging node 272 with transistors 270 and 271.

To transfer the programming voltage VPSW to bit line 56, WREE1 and WREE2 are both set to VPSW to enable transistors 274 and 276. EREE1 is set to HVPN and EREE2 is set to zero volts to disable the path to erase line 72 while providing high voltage protection. To transfer the programming voltage VPSW to erase line 72, EREE1 and EREE2 are both set to VPSW to enable transistors 280 and 282. WREE1 is set to HVPN and WREE2 is set to zero volts to disable transistors 274 and 276 and isolate bit line 56 from node 272 while providing high voltage protection. Given that VPSW can operate at either VDD in read mode or VPP in erase mode and write mode, WREE1 and WREE2 and EREE1 and EREE2 must each operate at three different levels. A driver circuit similar to driver 146 generates the three different levels for WREE1 and WREE2 and EREE1 and EREE2.

Figure 7:
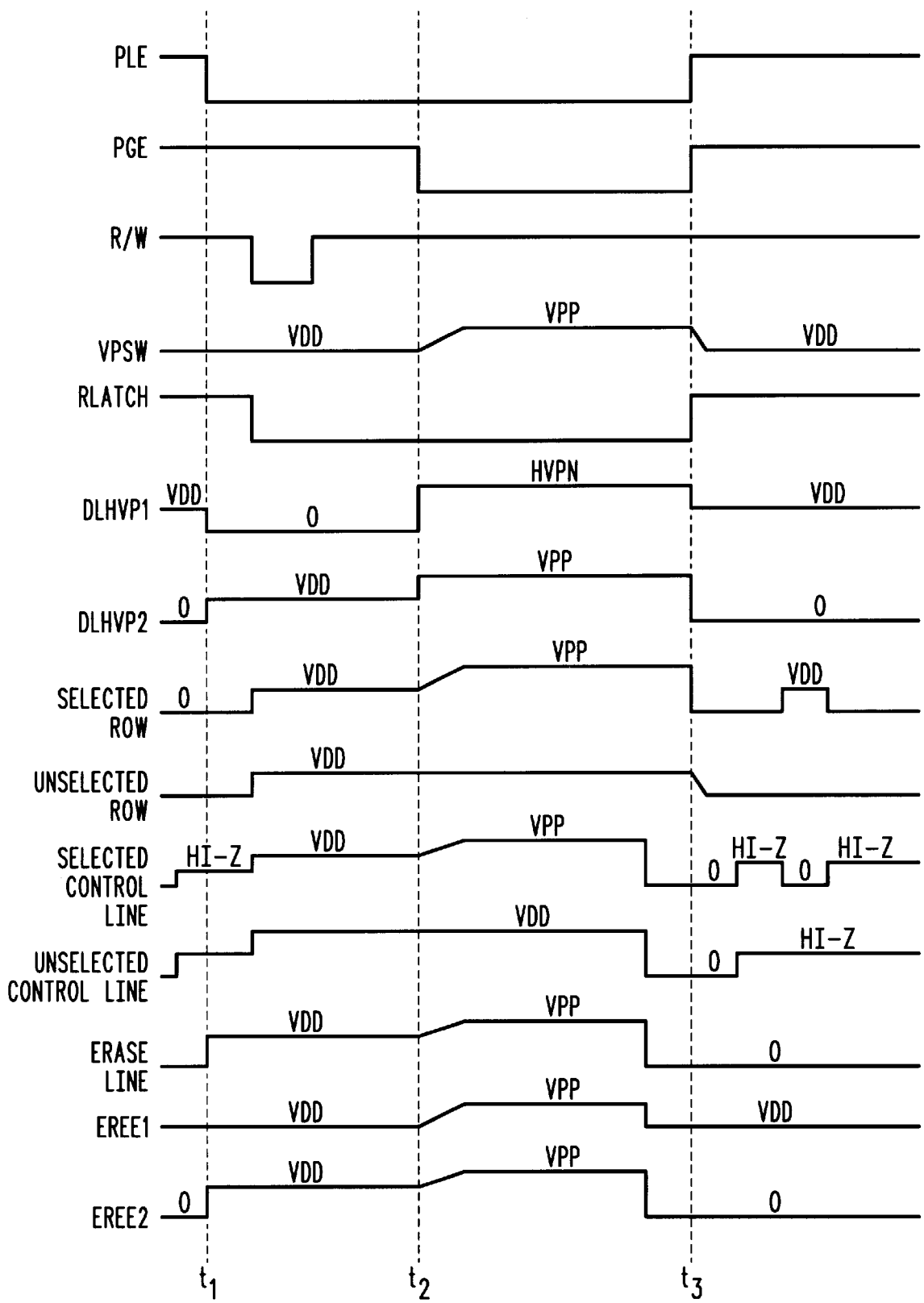
FIG. 7 is a waveform plot of an erase operation.

To review the overall operation of EEPROM 24, first consider erase mode in conjunction with the timing diagram illustrated in FIG. 7. W/E is set to logic zero and transistor 136 is disabled. PLE goes to logic zero at time $t_1$. The logic zero PLE opens switching circuits 78, 80, and 82. The common array ground node 96 is pulled to zero volts by transistor 98. DLHVP1 goes to zero volts and DLHVP2 goes to VDD to enable latches 60–64. Latches 60–64 are all reset to a high output impedance. Transistors 116–126 are enabled to pull all bit lines down to zero volts. Between times $t_1$ and $t_2$, the logic one $\overline{W/E}$ and logic one $\overline{R/W}$ produce a logic one at the output of AND gate 290 and turn on transistor 292 in FIG. 3. Transistor 292 pulls down the first section of bit line 56 to zero volts through selection network 58 and writes to latch 64. The output of latch 64 is VDD. The programming phase starts at time $t_2$. Switching circuit 70 is configured to route the output of latch 64 to erase line 72. All other latches remain high impedance. Erase line 72 is brought up to VPP=20 volts. The selected ROWn signal operating at VPP=20 volts turns on transistor 130 and select transistors 34, 40 and 46. The unselected rows goes to VDD and blocks erasure of those memory cells. The drains of selected floating gate transistors 36, 42, and 48 receive zero volts and their gates receive VPP=20 volts from erase line 72. The selected floating gates store a negative charge in about 10 milliseconds and become logic zero. A read cycle is shown starting at time $t_3$. Latches 60–64 are made transparent with DLHVP1 set to VDD and DLHVP2 set to zero volts.

Figure 8:
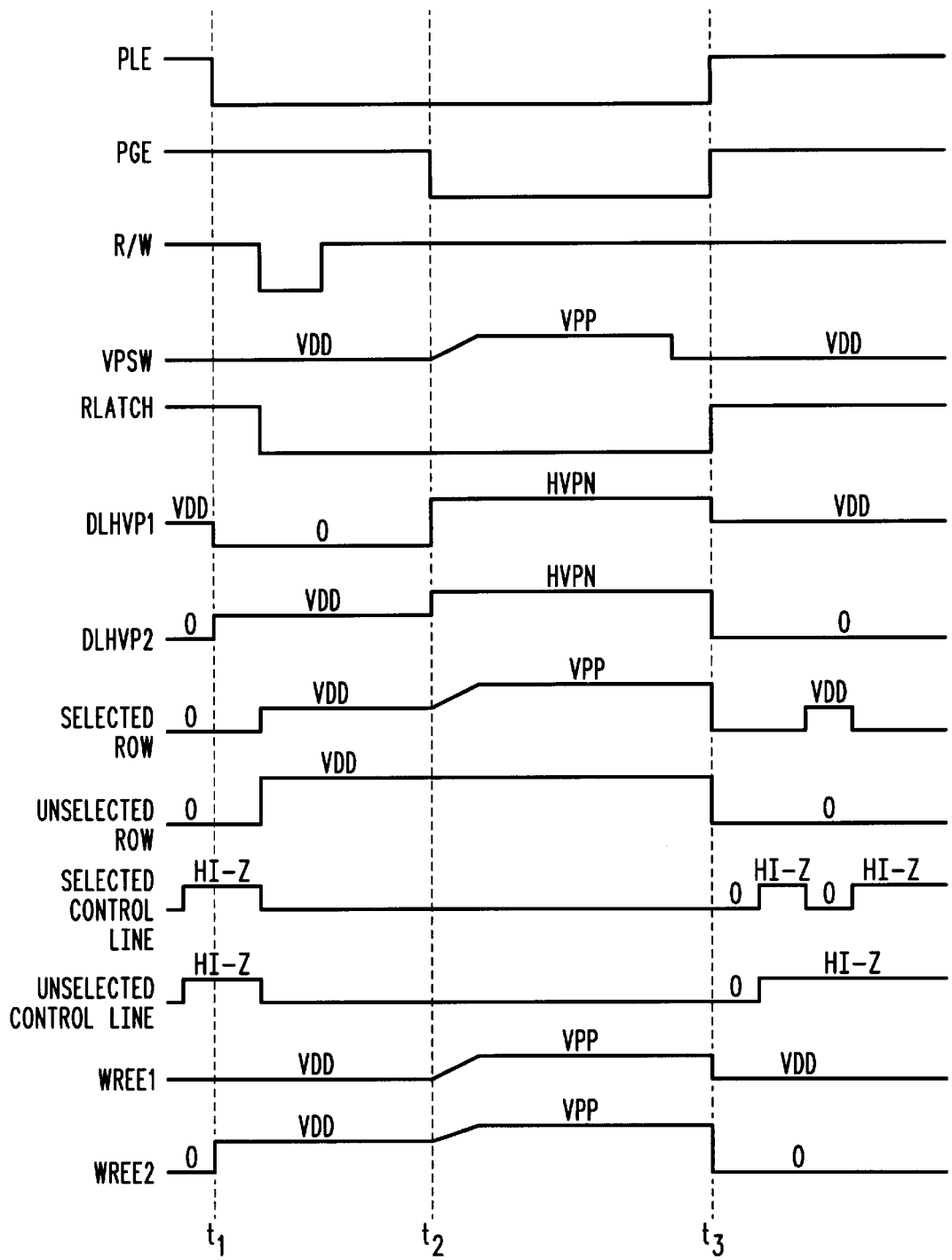
FIG. 8 is a waveform plot of a write operation.

FIG. 8 illustrates the timing diagram of write mode. W/E is set to logic one. PLE goes to logic zero at time $t_1$. The logic zero PLE opens switching circuits 78, 80, and 82. DLHVP1 goes to zero volts and DLHVP2 goes to VDD to enable latches 60–64. Latches 60–64 are all reset to a high output impedance. Between times $t_1$ and $t_2$, data from data bus 94 enables transistors 102–112 to write through selection network 58 to selected latches 60–64. Any latch not written to remains high impedance. The programming phase starts at time $t_2$. The outputs of the written latches 60–64 are brought up to VPP=20 volts after time $t_2$ and drive the corresponding bit lines 50–56. The selected ROWn signal operating at VPP=20 volts turns on transistor 130 and select transistors 34, 40 and 46. The unselected rows goes to VDD. Erase line 72 is pulled down to zero volts by transistor 136. The drains of selected floating gate transistors 36, 42, and 48 receive VPP=20 volts and their gates receive zero volts. The common array ground node 96 is floating. The selected floating gates store a positive charge in about 10 milliseconds and become logic one. A read cycle is shown starting at time $t_3$. Latches 60–64 are made transparent with DLHVP1 set to VDD and DLHVP2 set to zero volts.

By now it should be appreciated that the present invention provides a latch on each bit line so that all memory cells in one row to be written simultaneously. The input and output of the latches are transparent to the bit lines in read mode to avoid interfering with the data. One of the bit line latches is used in erase mode to drive the erase line.

What is claimed is:

1. A non-volatile memory circuit, comprising:
   a plurality of bit lines having first and second sections thereof;
   a plurality of memory cells having outputs respectively coupled to the plurality of bit lines at corresponding second sections thereof;
   a first switching circuit serially coupled in a first one of the plurality of bit lines for breaking continuity and separating the first one of the plurality of bit lines into the first and second sections thereof; and
   a first latch having an input coupled to the first section of the first one of the plurality of bit lines and an output coupled to the second section of the first one of the plurality of bit lines.

2. The non-volatile memory circuit of claim 1 further including:
   a second switching circuit serially coupled in a second one of the plurality of bit lines for breaking continuity and separating the second one of the plurality of bit lines into first and second sections; and
   a second latch having an input coupled to the first section of the second one of the plurality of bit lines and an output coupled to the second section of the second one of the plurality of bit lines.

3. The non-volatile memory circuit of claim 2 wherein the first and second switching circuits operate in response to a control signal for closing the first and second switching circuits during a read operation and opening the first and second switching circuits during a programming operation.

4. The non-volatile memory circuit of claim 3 further including:
   a first transistor having a first conduction terminal coupled to the first one of the plurality of bit lines and having a control terminal coupled for receiving a second control signal;
   a second transistor having a first conduction terminal coupled to a second conduction terminal of the first transistor, a control terminal coupled for receiving a first data signal, and a second conduction terminal coupled to a first power supply conductor;
   a third transistor having a first conduction terminal coupled to the second one of the plurality of bit lines and having a control terminal coupled for receiving the second control signal; and
   a fourth transistor having a first conduction terminal coupled to a second conduction terminal of the third transistor, a control terminal coupled for receiving a second data signal, and a second conduction terminal coupled to the first power supply conductor.

5. The non-volatile memory circuit of claim 1 wherein the first latch includes:
   a first inverter having an input coupled to the first section of the first one of the plurality of bit lines;
   a second inverter having an input coupled to an output of the first inverter and having an output coupled to the input of the first inverter; and
   a diode having an anode coupled to the output of the first inverter and having a cathode coupled to the second section of the first one of the plurality of bit lines.

6. The non-volatile memory circuit of claim 1 wherein the first switching circuit includes a first transistor having a first conduction terminal coupled to the first section of the first one of the plurality of bit lines, a second conduction terminal coupled to the second section of the first one of the plurality of bit lines, and a control terminal coupled for receiving a control signal for enabling the first transistor during a read operation and disabling the first transistor during a programming operation.

7. The non-volatile memory circuit of claim 1 wherein the plurality of memory cells are arranged on at least one semiconductor die that is embedded in a portable data carrier.

8. A method of latching a plurality of bit lines in a non-volatile memory array, comprising the steps of:
   providing a plurality of memory cells having outputs respectively coupled to the plurality of bit lines;
   setting a first one of the plurality of bit lines to a first voltage level;
   breaking continuity in the first one of the plurality of bit lines in response to a first state of a control signal to form first and second sections where the first section operates at the first voltage level; and
   latching the second section of the first one of the plurality of bit lines to a second voltage level.

9. The method of claim 8 wherein the step of latching includes the steps of:
   providing an input of a latch at the first section of the first one of the plurality of bit lines; and
   providing an output of the latch at the second section of the first one of the plurality of bit lines.

10. The method of claim 9 further comprising the steps of:
making continuity in the first one of the plurality of bit lines in response to a second state of the control signal; and isolating the input of the latch from the first section of the first one of the plurality of bit lines and the output of the latch from the second section of the first one of the plurality of bit lines.

11. The method of claim 8 further comprising the step of disposing the non-volatile memory array on at least one semiconductor die that is embedded in a portable data carrier.

12. A circuit responsive to a first voltage for latching a second voltage, comprising:

a latching circuit having an input coupled for receiving the first voltage from a first conductor, an output for latching the second voltage on a second conductor, a first power supply conductor coupled to a first power supply voltage terminal, and a second power supply conductor coupled to a second power supply voltage terminal, wherein the latching circuit includes a conduction path coupled between the first and second power supply conductors;

a driver circuit providing a first control signal operating at one of a plurality of voltage levels; and an isolation circuit serially coupled in the conduction path of the latching circuit and operating in response to a first level of the first control signal to isolate the input of the latching circuit from the first power supply conductor and the output of the latching circuit from the second power supply conductor.

13. The circuit of claim 12 wherein the isolation circuit operates in response to a second level of the first control signal to enable the conduction path in the latching circuit and provide voltage protection for the latching circuit.

14. The circuit of claim 12 wherein the latching circuit includes:

a first inverter having an input coupled to an input of the latching circuit; and a second inverter having an input coupled to an output of the first inverter at an output of the latching circuit and having an output coupled to an input of the first inverter.

15. The circuit of claim 14 wherein the first inverter includes:

a first transistor having a first conduction terminal coupled to the output of the latching circuit, a second conduction terminal coupled to the first power supply conductor, and a control terminal coupled to the input of the latching circuit; and a second transistor having a first conduction terminal coupled to the output of the latching circuit, a second conduction terminal coupled to the second power supply conductor, and a control terminal coupled to the input of the latching circuit.

16. The circuit of claim 15 wherein the second inverter includes:

a third transistor having a first conduction terminal coupled to the input of the latching circuit, a second conduction terminal coupled to the first power supply conductor, and a control terminal coupled to the output of the latching circuit; and a fourth transistor having a first conduction terminal coupled to the input of the latching circuit, a second conduction terminal coupled to the second power supply conductor, and a control terminal coupled to the output of the latching circuit.

17. The circuit of claim 16 wherein the isolation circuit includes:

a fifth transistor having a first conduction terminal coupled to the first conduction terminal of the third transistor, a second conduction terminal coupled to the input of the latching circuit, and a control terminal coupled for receiving the first control signal from the driver circuit to provide isolation in response to a first level of the first control signal and voltage protection in response to a second level of the first control signal;

a sixth transistor having a first conduction terminal coupled to the first conduction terminal of the fourth transistor, a second conduction terminal coupled to the input of the latching circuit, and a control terminal coupled for receiving a second control signal from the driver circuit to provide isolation in response to a first level of the second control signal and voltage protection in response to a second level of the second control signal;

a seventh transistor having a first conduction terminal coupled to the first conduction terminal of the first transistor, a second conduction terminal coupled to the output of the latching circuit, and a control terminal coupled for receiving the first control signal from the driver circuit to provide isolation in response to the first level of the first control signal and voltage protection in response to the second level of the second control signal; and an eighth transistor having a first conduction terminal coupled to the first conduction terminal of the second transistor, a second conduction terminal coupled to the output of the latching circuit, and a control terminal coupled for receiving the second control signal from the driver circuit to provide isolation in response to the first level of the second control signal and voltage protection in response to the second level of the second control signal.

18. The circuit of claim 12 further including a plurality of memory cells arranged on at least one semiconductor die that is embedded in a portable data carrier where the plurality of memory cells have outputs respectively coupled to a plurality of bit lines and where the input and output of the latching circuit are coupled to one of the plurality of bit lines.

19. A method of isolating an input of a latching circuit from a first conductor and an output of the latching circuit from a second conductor, comprising the steps of:

providing a conduction path in the latching circuit coupled between first and second power supply conductors;

providing a first control signal operating at one of a plurality of voltage levels; and disabling the conduction path in the latching circuit in response to a first level of the first control signal to isolate the input of the latching circuit from the first conductor and the output of the latching circuit from the second conductor.

20. The method of claim 19 further comprising the step of enabling the conduction path in the latching circuit in response to a second level of the first control signal to provide voltage protection for the latching circuit.

21. The method of claim 19 further comprising the step of providing a plurality of memory cells arranged on at least one semiconductor die that is embedded in a portable data carrier where the plurality of memory cells have outputs respectively coupled to a plurality of bit lines and where the input and output of the latching circuit are coupled to one of the plurality of bit lines.

22. A non-volatile memory circuit, comprising:
   a plurality of memory cells having outputs respectively coupled to a plurality of bit lines and having control inputs coupled to a common control line;
   a latch having an input coupled to a first one of the plurality of bit lines;
   a first switching circuit having an input coupled to an output of the latch, a first output coupled to the first one of the plurality of bit lines, and a second output coupled to an erase line; and
   a first programming transistor having a first conduction terminal coupled to the erase line, a control terminal coupled for receiving a row select signal, and a second conduction terminal coupled to the common control line of the plurality of memory cells.

23. The non-volatile memory circuit of claim 22 further including a second switching circuit serially coupled in the first one of the plurality of bit lines for breaking continuity and separating the first one of the plurality of bit lines into first and second sections.

24. The non-volatile memory circuit of claim 23 wherein the first switching circuit includes:
   a first transistor having a first conduction terminal coupled to the output of the latch, a second conduction terminal coupled to the second section of the first one of the plurality of bit lines, and a control terminal coupled for receiving a first multi-level control signal; and
   a second transistor having a first conduction terminal coupled to the output of the latch, a second conduction terminal coupled to the erase line, and a control terminal coupled for receiving a second multi-level control signal.

25. The non-volatile memory circuit of claim 24 wherein the first switching circuit further includes:
   a third transistor having a first conduction terminal coupled to the second conduction terminal of the first transistor, a second conduction terminal coupled to the second section of the first one of the plurality of bit lines, and a control terminal coupled for receiving a third multi-level control signal; and
   a fourth transistor having a first conduction terminal coupled to the second conduction terminal of the second transistor, a second conduction terminal coupled to the erase line, and a control terminal coupled for receiving a fourth multi-level control signal.

26. The non-volatile memory circuit of claim 24 wherein the first switching circuit further includes a third transistor having a first conduction terminal coupled to a first power supply conductor, a second conduction terminal coupled to the output of the latch, and a control terminal coupled for receiving a pre-charge signal.

27. The non-volatile memory circuit of claim 22 wherein the plurality of memory cells are arranged on at least one semiconductor die that is embedded in a portable data carrier.

28. A method of sharing a latch in a non-volatile memory array, comprising the steps of:
   providing a plurality of memory cells having outputs respectively coupled to a plurality of bit lines;
   providing a latch having an input coupled to a first one of the plurality of bit lines; and
   switching an output of the latch between the first one of the plurality of bit lines and an erase line in response to first and second multi-level control signals.

29. The method of claim 28 further including the steps of:
   providing voltage protection between the output of the latch and the first one of the plurality of bit lines in response to a third multi-level control signal; and
   providing voltage protection between the output of the latch and the erase line in response to a fourth multi-level control signal.

30. The method of claim 28 further including the steps of:
   breaking continuity in the first one of the plurality of bit lines in response to a first state of a control signal to form first and second sections; and
   routing the output of the latch to the second section of the first one of the plurality of bit lines to latch a voltage level on the second section of the first one of the plurality of bit lines.

31. The method of claim 28 further comprising the step of arranging the non-volatile memory array on at least one semiconductor die that is embedded in a portable data carrier.

* * * * *